United States Patent
Frank et al.

(10) Patent No.: US 9,548,223 B2
(45) Date of Patent: Jan. 17, 2017

(54) APPARATUS FOR TREATING SURFACES OF WAFER-SHAPED ARTICLES

(75) Inventors: Dieter Frank, Velden (AT); Robert Rogatschnig, Villach (AT); Andreas Gleissner, Radenthein (AT)

(73) Assignee: LAM RESEARCH AG, Villach (AT)

(*) Notice: Subject to any disclaimer, the term of this patent is extended or adjusted under 35 U.S.C. 154(b) by 1265 days.

(21) Appl. No.: 13/336,685

(22) Filed: Dec. 23, 2011

(65) Prior Publication Data
US 2013/0160260 A1   Jun. 27, 2013

(51) Int. Cl.
*H01L 21/67* (2006.01)
*H01L 21/687* (2006.01)

(52) U.S. Cl.
CPC ..... *H01L 21/67051* (2013.01); *H01L 21/6708* (2013.01); *H01L 21/6719* (2013.01); *H01L 21/67115* (2013.01); *H01L 21/67126* (2013.01); *H01L 21/68728* (2013.01); *Y10T 29/41* (2015.01)

(58) Field of Classification Search
None
See application file for complete search history.

(56) References Cited

U.S. PATENT DOCUMENTS

| | | | |
|---|---|---|---|
| 4,903,717 A | 2/1990 | Sumnitsch | |
| 5,513,668 A | 5/1996 | Sumnitsch | |
| 5,871,588 A | 2/1999 | Moslehi et al. | |
| 6,440,320 B1 * | 8/2002 | Shinozaki | 216/90 |
| 6,485,531 B1 | 11/2002 | Schob | |
| 2006/0151014 A1 | 7/2006 | Obweger et al. | |
| 2007/0277734 A1 | 12/2007 | Lubomirsky et al. | |
| 2009/0079122 A1 | 3/2009 | Obweger | |
| 2010/0133257 A1 | 6/2010 | Sorabji et al. | |

FOREIGN PATENT DOCUMENTS

| | | |
|---|---|---|
| TW | 200505599 A | 2/2005 |
| TW | 200739800 A | 10/2007 |
| TW | 200807510 A | 2/2008 |
| TW | 201029070 A | 8/2010 |
| WO | 2007/101764 | 9/2007 |

OTHER PUBLICATIONS

International Search Report, dated May 2, 2013, from corresponding PCT application.
Second Chinese Office Action for CN Application No. 201280063592.0 dated Jul. 5, 2016, 2016; Based on PCT Application No. PCT/IB2012/057383; Title: "Apparatus for Treating Surfaces of Wafer-Shaped Articles"; 17 pages.

* cited by examiner

*Primary Examiner* — Michael Kornakov
*Assistant Examiner* — Ryan Coleman

(57) ABSTRACT

A device and method for processing wafer-shaped articles comprises a process chamber and a rotary chuck located within the process chamber. The rotary chuck is adapted to be driven without physical contact through a magnetic bearing. The rotary chuck comprises a series of gripping pins adapted to hold a wafer shaped article in a position depending downwardly from the rotary chuck. The rotary chuck further comprises a plate that rotates together with the rotary chuck. The plate is positioned above an area occupied by the wafer-shaped article, and shields upper surfaces of the process chamber from liquids flung off of a wafer-shaped article during use of the rotary chuck.

12 Claims, 2 Drawing Sheets

APPARATUS FOR TREATING SURFACES OF WAFER-SHAPED ARTICLES

BACKGROUND OF THE INVENTION

1. Field of the Invention

The invention relates generally to an apparatus for treating surfaces of wafer-shaped articles, such as semiconductor wafers, wherein one or more treatment fluids may be recovered from within a closed process chamber.

2. Description of Related Art

Semiconductor wafers are subjected to various surface treatment processes such as etching, cleaning, polishing and material deposition. To accommodate such processes, a single wafer may be supported in relation to one or more treatment fluid nozzles by a chuck associated with a rotatable carrier, as is described for example in U.S. Pat. Nos. 4,903,717 and 5,513,668.

Alternatively, a chuck in the form of a ring rotor adapted to support a wafer may be located within a closed process chamber and driven without physical contact through an active magnetic bearing, as is described for example in International Publication No. WO 2007/101764 and U.S. Pat. No. 6,485,531. Treatment fluids which are driven outwardly from the edge of a rotating wafer due to centrifugal action are delivered to a common drain for disposal.

Conventional rotary chucks that are adapted to be driven without physical contact through a magnetic bearing, expose both sides of a wafer to the process chamber ambient, which the present inventors have discovered can give rise to various disadvantages.

SUMMARY OF THE INVENTION

The present invention in one aspect relates to a device for processing wafer-shaped articles, comprising a process chamber and a rotary chuck located within the process chamber. The rotary chuck is adapted to be driven without physical contact through a magnetic bearing. The rotary chuck comprises a series of gripping pins adapted to hold a wafer shaped article in a position depending downwardly from the rotary chuck. The rotary chuck further comprises a plate that rotates together with the rotary chuck. The plate is positioned above an area occupied by a wafer-shaped article when the rotary chuck is in use, and the plate shields upper surfaces of the process chamber from liquids flung off of a wafer-shaped article during use of the rotary chuck.

In preferred embodiments of the device according to the present invention, the plate is positioned parallel to a plane in which a major surface of a wafer shaped article will be present during use of the rotary chuck, thereby to define a gap of a predetermined width between the plate and the plane.

In preferred embodiments of the device according to the present invention, the predetermined width is from about 0.1 to 5 mm, and preferably from about 0.5 to 2 mm.

In preferred embodiments of the device according to the present invention, the plate is positioned parallel to an overlying lid of the process chamber, thereby to define a gap of a predetermined width between the plate and the lid.

In preferred embodiments of the device according to the present invention, the predetermined width is from about 0.1 to 10 mm, preferably from about 0.5 to 5 mm, and more preferably from about 1 to 3 mm.

In preferred embodiments of the device according to the present invention, the process chamber comprises a lid overlying the plate, and a nozzle assembly mounted on the lid, the nozzle assembly having a discharge end traversing the lid and a central region of the plate, whereby process fluids can be supplied via the nozzle assembly to an upwardly-facing surface of a wafer-shaped article during use of the device.

In preferred embodiments of the device according to the present invention, the device further comprises at least one infra-red (IR) lamp positioned outside the process chamber and overlying the plate.

In preferred embodiments of the device according to the present invention, the at least one IR lamp is positioned adjacent a lid of the process chamber, and wherein at least a portion of the lid and the plate are formed from materials transparent to IR radiation emitted by the at least one IR lamp.

In preferred embodiments of the device according to the present invention, the process chamber comprises an interior cover disposed within the process chamber, the interior cover being movable between a first position in which the rotary chuck communicates with an outer wall of the closed process chamber, and a second position in which the interior cover seals against an inner surface of the closed process chamber adjacent the rotary chuck to define a gas-tight inner process chamber.

In preferred embodiments of the device according to the present invention, the interior cover forms a lower portion of the inner process chamber when in the second position.

In preferred embodiments of the device according to the present invention, the magnetic bearing comprises a stator located outside the closed process chamber.

The present invention in another aspect relates to a method for processing wafer-shaped articles, comprising positioning a wafer-shaped article on a rotary chuck within a process chamber such that the wafer-shaped article is held by the rotary chuck in a position depending downwardly from the rotary chuck, and forming a film of liquid in a gap between an upper side of the wafer-shaped article and a plate carried by the rotary chuck, the plate overlying and extending parallel to the wafer-shaped article, thereby to define a gap of a predetermined width.

In preferred embodiments of the method according to the present invention, the predetermined width is from about 0.1 to 5 mm, and preferably from about 0.5 to 2 mm.

In preferred embodiments of the method according to the present invention, the rotary chuck is adapted to be driven without physical contact through a magnetic bearing.

In preferred embodiments of the method according to the present invention, the method also includes heating the wafer-shaped article using at least one infra-red (IR) lamp positioned outside the process chamber, wherein portions of the process chamber and the plate overlying the wafer-shaped article are transparent to IR radiation emitted by the at least one IR lamp.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
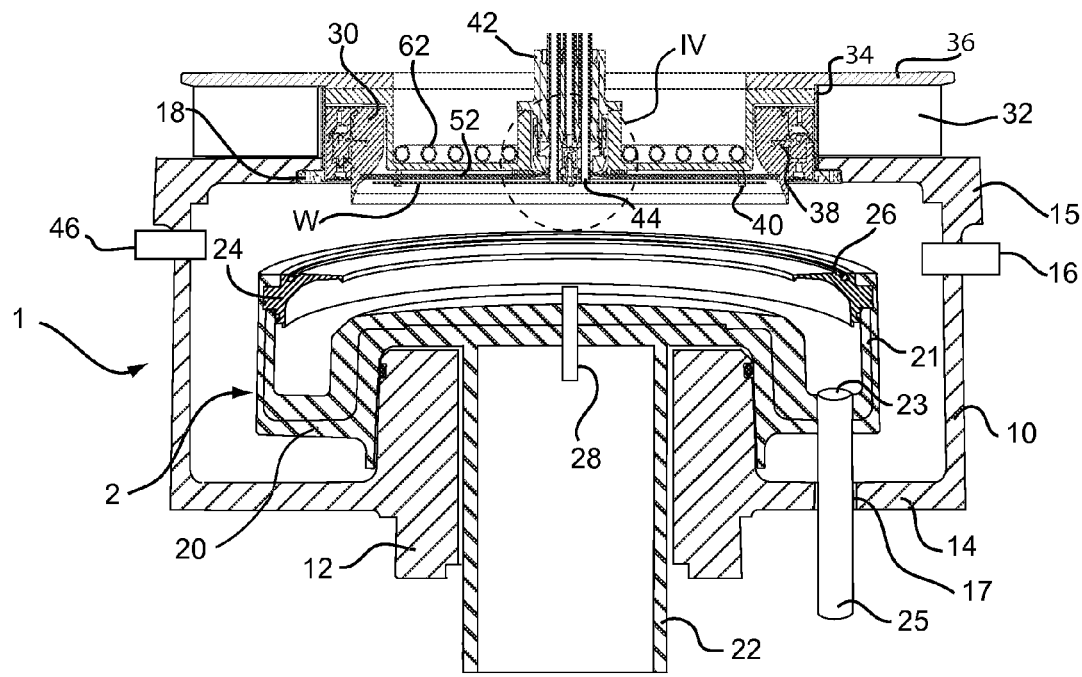
FIG. 1 is an explanatory cross-sectional side view of a process chamber according to a first embodiment of the invention, with the interior cover shown in its first position.

Referring now to FIG. 1, an apparatus for treating surfaces of wafer-shaped articles according to a first embodiment of the invention comprises an outer process chamber 1, which is preferably made of aluminum coated with PFA (perfluoroalkoxy) resin. The chamber in this embodiment has a main cylindrical wall 10, a lower part 12 and an upper part 15. From upper part 15 there extends a narrower cylindrical wall 34, which is closed by a lid 36.

A rotary chuck 30 is disposed in the upper part of chamber 1, and surrounded by the cylindrical wall 34. Rotary chuck 30 rotatably supports a wafer W during used of the apparatus. The rotary chuck 30 incorporates an annular drive comprising ring gear 38, which engages and drives a plurality of eccentrically movable gripping members 40 for selectively contacting and releasing the peripheral edge of a wafer W.

In this embodiment, the rotary chuck 30 is a ring rotor provided adjacent to the interior surface of the cylindrical wall 34. A stator 32 is provided opposite the ring rotor adjacent the outer surface of the cylindrical wall 34. The rotor 30 and stator 32 serve as a motor by which the ring rotor 30 (and thereby a supported wafer W) may be rotated through an active magnetic bearing. For example, the stator 32 can comprise a plurality of electromagnetic coils or windings that may be actively controlled to rotatably drive the rotary chuck 30 through corresponding permanent magnets provided on the rotor. Axial and radial bearing of the rotary chuck 30 may be accomplished also by active control of the stator or by permanent magnets. Thus, the rotary chuck 30 may be levitated and rotatably driven free from mechanical contact. Alternatively, the rotor may be held by a passive bearing where the magnets of the rotor are held by corresponding high-temperature-superconducting magnets (HTS-magnets) that are circumferentially arranged on an outer rotor outside the chamber. With this alternative embodiment each magnet of the ring rotor is pinned to its corresponding HTS-magnet of the outer rotor. Therefore the inner rotor makes the same movement as the outer rotor without being physically connected.

The lid 36 has a nozzle assembly 42 mounted on its exterior, which supplies a medium inlet 44 that traverses the lid 36 and opens into the chamber above the wafer W. It will be noted that the wafer W in this embodiment hangs downwardly from the rotary chuck 30, supported by the gripping members 40, such that fluids supplied through inlet 44 would impinge upon the upwardly facing surface of the wafer W.

Rotary chuck 30 also comprises a plate 52 that is positioned above a wafer W when the chuck 30 is in use. Plate 52 preferably overlies the entire upper surface of wafer W, except where the plate 52 is open to permit passage of the discharge end of the nozzle assembly 42.

The lid 36 in this embodiment also includes a set of IR heating elements 62, which permit a wafer W to be rapidly heated through the intervening thickness of the lid 36 and the plate 52, both of which are therefore made in this embodiment of a material that is substantially transparent to the IR radiation emitted by the heating elements 62, such as quartz glass.

In case wafer 30 is a semiconductor wafer, for example of 300 mm or 450 mm diameter, the upwardly facing side of wafer W could be either the device side or the obverse side of the wafer W, which is determined by how the wafer is positioned on the rotary chuck 30, which in turn is dictated by the particular process being performed within the chamber 1.

The apparatus of FIG. 1 further comprises an interior cover 2, which is movable relative to the process chamber 1. Interior cover 2 is shown in FIG. 1 in its first, or open, position, in which the rotary chuck 30 is in communication with the outer cylindrical wall 10 of chamber 1. Cover 2 in this embodiment is generally cup-shaped, comprising a base 20 surrounded by an upstanding cylindrical wall 21. Cover 2 furthermore comprises a hollow shaft 22 supporting the base 20, and traversing the lower wall 14 of the chamber 1.

Hollow shaft 22 is surrounded by a boss 12 formed in the main chamber 1, and these elements are connected via a dynamic seal that permits the hollow shaft 22 to be displaced relative to the boss 12 while maintaining a gas-tight seal with the chamber 1.

At the top of cylindrical wall 21 there is attached an annular deflector member 24, which carries on its upwardly-facing surface a gasket 26. Cover 2 preferably comprises a fluid medium inlet 28 traversing the base 20, so that process fluids and rinsing liquid may be introduced into the chamber onto the downwardly facing surface of wafer W.

Cover 2 furthermore includes a process liquid discharge opening 23, which opens into a discharge pipe 25. Whereas pipe 25 is rigidly mounted to base 20 of cover 2, it traverses the bottom wall 14 of chamber 1 via a dynamic seal 17 so that the pipe may slide axially relative to the bottom wall 14 while maintaining a gas-tight seal.

An exhaust opening 16 traverses the wall 10 of chamber 1, whereas a separate exhaust opening (not shown) traverses the lid 36. Each exhaust opening is connected to suitable exhaust conduits (not shown), which are preferably independently controlled via respective valves and venting devices.

The position depicted in FIG. 1 corresponds to loading or unloading of a wafer W. In particular, a wafer W can be loaded onto the rotary chuck 30 through a side door 46 in the chamber wall 10. However, when the lid 36 is in position and when side door 46 has been closed, the chamber 1 is gas-tight and able to maintain a defined internal pressure.

Figure 2:
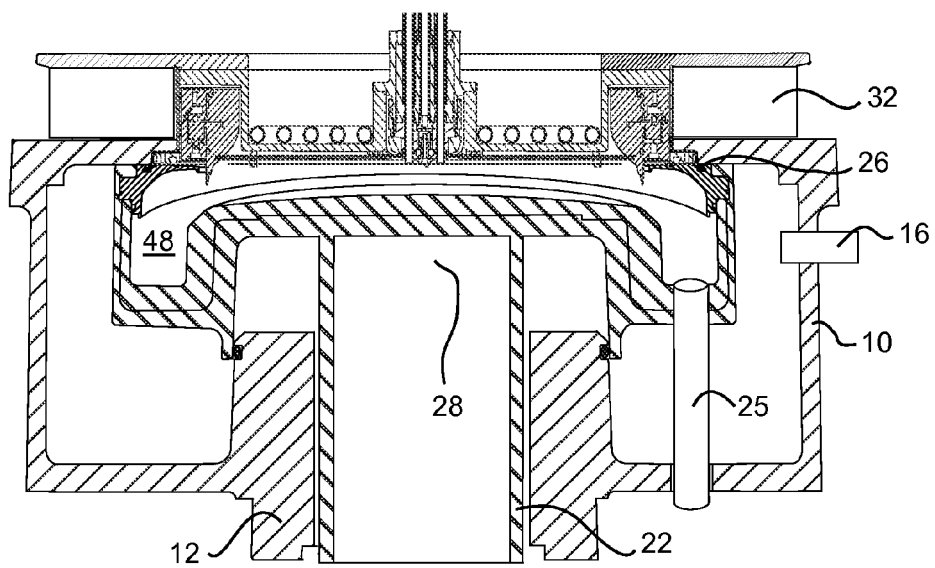
FIG. 2 is an explanatory cross-sectional side view of a process chamber according to the first embodiment of the invention, with the interior cover shown in its second position.

In FIG. 2, the interior cover 2 has been moved to its second, or closed, position, which corresponds to processing of a wafer W. That is, after a wafer W is loaded onto rotary chuck 30, the cover 2 is moved upwardly relative to chamber 1, by a suitable motor (not shown) acting upon the hollow shaft 22. The upward movement of the interior cover 2 continues until the deflector member 24 comes into contact with the interior surface of the upper part 15 of chamber 1. In particular, the gasket 26 carried by deflector 24 seals against the underside of upper part 15, whereas the gasket 18 carried by the upper part 15 seals against the upper surface of deflector 24.

When the interior cover 2 reaches its second position as depicted in FIG. 2, there is thus created a second chamber 48 within the closed process chamber 1. Inner chamber 48 is moreover sealed in a gas tight manner from the remainder of the chamber 1. Moreover, the chamber 48 is preferably separately vented from the remainder of chamber 1, which is achieved in this embodiment by the provision of an exhaust port opening into the chamber 48, independently from the exhaust port 16 that serves the chamber 1 in general, and the remainder of the chamber 1 in the FIG. 2 configuration.

During processing of a wafer, processing fluids may be directed through nozzle assembly 42 through the central opening in plate 52 and onto a rotating wafer W in order to perform various processes, such as etching, cleaning, rinsing, and any other desired surface treatment of the wafer undergoing processing.

Provision of the plate 52 integrated with chuck 30, between wafer W and the top 36 of chamber 1, gives rise to a number of advantages. This plate 52 can be quartz in case an IR lamp is used to heat up the media (e.g. sulfuric acid) to guarantee the IR transparency.

The plate 52 in use is rotating with the chuck and at the same speed thereof, and hence also is rotating with a wafer W gripped by the chuck 30, and also at the same speed as wafer 30. This design therefore serves to minimize turbulence in the employed process fluids.

Moreover, when IR heating lamps are used, the plate 52 permits preventing residual heat transfer, because the gap between the chuck 30 and the lamps, i.e., the gap above plate 52 and below lid 36, can be actively cooled (for example, with nitrogen and/or deionized water).

Furthermore, it is possible to minimize temperature differences during a drying process by cooling the plate 52 with deionized water. Still further, residual process media above the wafer W on the underside of plate 52, caused for example by splashing and/or condensation, can be rinsed simultaneously during the aforementioned deionized water rinse, or can be rinsed with deionized water after completion of the process.

As the plate 52 segregates the chamber interior from the upwardly facing side of the wafer W, this serves to minimize contamination by backsplashing and or particles. Plate 52 furthermore permits enhanced atmosphere control above the wafer. Still further, this design also allows gap processes, i.e., processes in which the gap between wafer and the chuck is filled with liquid.

Figure 3:
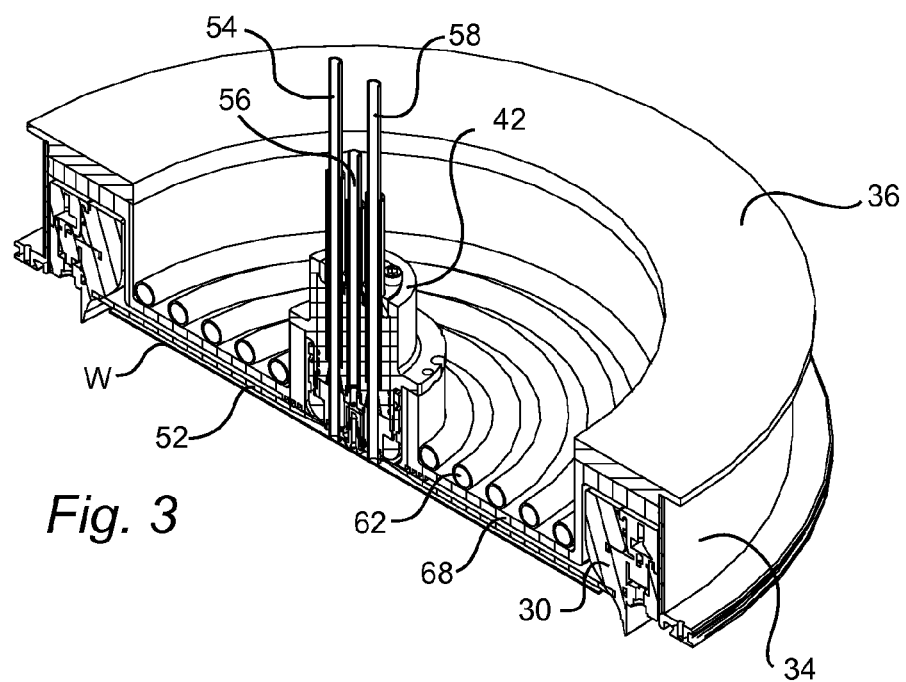
FIG. 3 is an explanatory cross-sectional perspective view of the lid and chuck of the first embodiment, with a wafer in position.

FIG. 3 shows only the lid 36 and chuck 30 of FIGS. 1 and 2, with a wafer W still in position. IR lamps 62 are formed as a series of concentric circular elements, and are individually controllable to provide a tuned heating of a wafer W. Nozzle assembly 42 in this embodiment comprises three separate conduits 54, 56, 58 each connected to a respective supply of a process fluid. For example, one of the conduits may supply deionized water, another nitrogen gas, and the third a process fluid such as concentrated sulfuric acid.

At least the lower portion 68 of lid 36, like plate 52, is formed of a material that is substantially transparent to the wavelengths of the IR lamps 62, an example of the material utilized for lid portion 68 and plate 52 in this embodiment being quartz. When IR lamps 62 are not used, then both plate 52 and lid portion 68 may be formed from other materials, such as aluminum coated with PFA (perfluoroalkoxy) resin.

Figure 4:
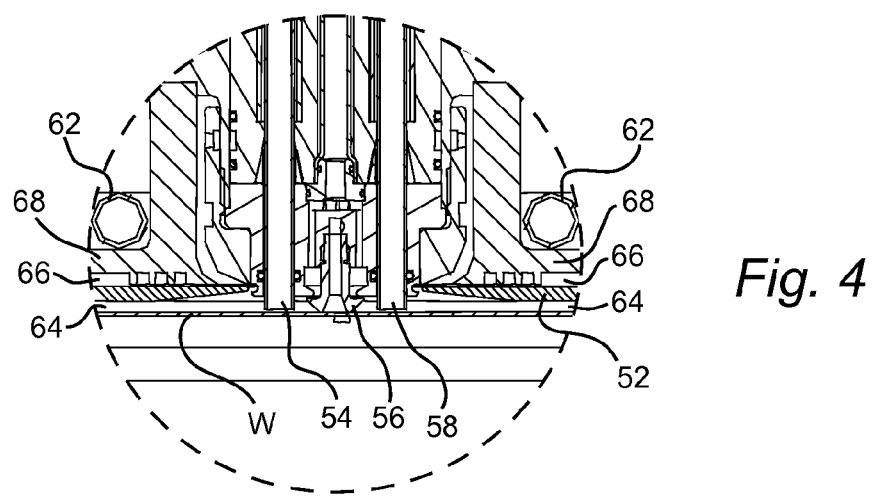
FIG. 4 is an enlarged view of the detail IV in FIG. 1.

In the detail of FIG. 4, it can be seen that plate 52 is spaced from the underlying wafer W by a small gap 64, which is preferably from about 0.1 to 5 mm, and more preferably from about 0.5 to 2 mm. Gap 64 permits performing gap processes as noted above, i.e., processes in which the gap between wafer and the chuck is filled with liquid.

FIG. 4 also shows that the plate 52 is spaced from the overlying lid portion 68 by a small gap 66, which is preferably from about 0.1 to 10 mm, more preferably from about 0.5 to 5 mm, and still more preferably from about 1 to 3 mm. Gap 66 permits the plate 52 and hence the wafer W to be actively cooled, for example with nitrogen and/or deionized water, thereby to prevent residual heat transfer from wafer W after it has been heated using IR lamps 62. The same active cooling technique can be utilized to minimize temperature differences during a drying process.

What is claimed is:

1. Device for processing wafer-shaped articles, comprising a process chamber and a rotary chuck located within said process chamber, wherein said rotary chuck is adapted to be driven without physical contact through a magnetic bearing, said rotary chuck comprising a series of gripping pins adapted to hold a wafer shaped article in a position depending downwardly from said rotary chuck, said rotary chuck further comprising a plate that rotates together with said rotary chuck, said plate being positioned above an area occupied by a wafer-shaped article when said rotary chuck is in use, and said plate shielding upper surfaces of said process chamber from liquids flung off of a wafer-shaped article during use of said rotary chuck;

wherein said magnetic bearing comprises a stator located entirely outside the process chamber, and a rotor located entirely inside the process chamber.

2. The device according to claim 1, wherein said plate is positioned parallel to a plane in which a major surface of a wafer shaped article will be present during use of said rotary chuck, thereby to define a gap of a predetermined width between said plate and said plane.

3. The device according to claim 2, wherein said predetermined width is from about 0.1 to 5 mm.

4. The device according to claim 1, wherein said plate is positioned parallel to an overlying lid of said process chamber, thereby to define a gap of a predetermined width between said plate and said lid.

5. The device according to claim 4, wherein said predetermined width is from about 0.1 to 10 mm.

6. The device according to claim 1, wherein said process chamber comprises a lid overlying said plate, and a nozzle assembly mounted on said lid, said nozzle assembly having a discharge end traversing said lid and a central region of said plate, whereby process fluids can be supplied via said nozzle assembly to an upwardly-facing surface of a wafer-shaped article during use of said device.

7. The device according to claim 1, further comprising at least one infra-red (IR) lamp positioned outside said process chamber and overlying said plate.

8. The device according to claim 7, wherein said at least one IR lamp is positioned adjacent a lid of said process chamber, and wherein at least a portion of said lid and said plate are formed from materials transparent to IR radiation emitted by said at least one IR lamp.

9. The device according to claim 1, wherein said process chamber comprises an interior cover disposed within said process chamber, said interior cover being movable between a first position in which said rotary chuck communicates with an outer wall of said process chamber, and a second position in which said interior cover seals against an inner surface of said process chamber adjacent said rotary chuck to define a gas-tight inner process chamber.

10. The device according to claim 9, wherein said interior cover forms a lower portion of said inner process chamber when in said second position.

11. Device for processing wafer-shaped articles, comprising a process chamber and a rotary chuck located within said process chamber, wherein said rotary chuck is adapted to be driven without physical contact through a magnetic bearing, said rotary chuck comprising a series of gripping pins adapted to hold a wafer shaped article in a position depending downwardly from said rotary chuck, said rotary chuck further comprising a plate that rotates together with said rotary chuck, said plate being positioned above an area occupied by a wafer-shaped article when said rotary chuck is in use, and said plate shielding upper surfaces of said process chamber from liquids flung off of a wafer-shaped article during use of said rotary chuck;

wherein said process chamber comprises an interior cover disposed within said process chamber, said interior cover being movable between a first position in which said rotary chuck communicates with an outer wall of said process chamber, and a second position in which said interior cover seals against an inner surface of said process chamber adjacent said rotary chuck to define a gas-tight inner process chamber.

12. Device for processing wafer-shaped articles, comprising a process chamber and a rotary chuck located within said process chamber, wherein said rotary chuck is adapted to be driven without physical contact through a magnetic bearing, said rotary chuck comprising a series of gripping pins adapted to hold a wafer shaped article in a position depending downwardly from said rotary chuck, said rotary chuck further comprising a plate that rotates together with said rotary chuck, said plate being positioned above an area occupied by a wafer-shaped article when said rotary chuck is in use, and said plate shielding upper surfaces of said process chamber from liquids flung off of a wafer-shaped article during use of said rotary chuck;

wherein said process chamber comprises an interior cover disposed within said process chamber, said interior cover being movable between a first position in which said rotary chuck communicates with an outer wall of said process chamber, and a second position in which said interior cover seals against an inner surface of said process chamber adjacent said rotary chuck to define a gas-tight inner process chamber; and wherein said interior cover forms a lower portion of said inner process chamber when in said second position.

\* \* \* \* \*